US012104903B2

(12) United States Patent
Wojtsekhowski et al.

(10) Patent No.: US 12,104,903 B2
(45) Date of Patent: Oct. 1, 2024

(54) SPINNING HALL PROBE COMPASS

(71) Applicant: JEFFERSON SCIENCE ASSOCIATES, LLC, Newport News, VA (US)

(72) Inventors: Bogdan Wojtsekhowski, Yorktown, VA (US); Guy Ron, Mevaseret Zion (IL)

(73) Assignee: JEFFERSON SCIENCE ASSOCIATES, LLC, Newport News, VA (US)

( * ) Notice: Subject to any disclaimer, the term of this patent is extended or adjusted under 35 U.S.C. 154(b) by 444 days.

(21) Appl. No.: 17/671,112

(22) Filed: Feb. 14, 2022

(65) Prior Publication Data
US 2022/0282970 A1   Sep. 8, 2022

Related U.S. Application Data

(60) Provisional application No. 63/158,172, filed on Mar. 8, 2021.

(51) Int. Cl.
*G01C 17/32* (2006.01)
*G01R 33/07* (2006.01)

(52) U.S. Cl.
CPC .............. *G01C 17/32* (2013.01); *G01R 33/07* (2013.01)

(58) Field of Classification Search
CPC .................................. G01C 17/32; G01R 33/07
USPC ........................................................ 33/355 R
See application file for complete search history.

(56) References Cited

U.S. PATENT DOCUMENTS

| 3,634,946 | A | 1/1972 | Star | |
|---|---|---|---|---|
| 3,855,711 | A * | 12/1974 | Kawada | G01C 19/38 33/327 |
| 5,233,759 | A | 8/1993 | Gloor et al. | |
| 6,561,813 | B2 * | 5/2003 | Rutten | H01R 39/08 439/26 |
| 6,742,604 | B2 * | 6/2004 | Brazil | E21B 47/024 175/45 |
| 6,908,310 | B1 | 6/2005 | Olsson | |
| 7,038,448 | B2 * | 5/2006 | Schott | G01R 33/05 73/514.31 |
| 7,412,905 | B1 | 8/2008 | Bishel | |
| 8,395,374 | B2 | 3/2013 | Newman | |
| 8,963,540 | B2 * | 2/2015 | Reymond | G01D 5/145 324/207.2 |
| 9,389,284 | B2 | 7/2016 | Motz | |
| 9,464,480 | B2 * | 10/2016 | Hay | H02N 2/105 |

(Continued)

OTHER PUBLICATIONS

Schott, Christian, et al., "CMOS Single-Chip Electronic Compass with Microcontroller", IEEE Journal of Solid-State Circuits, Dec. 2007, vol. 42, No. 12, 2923-2933.

(Continued)

*Primary Examiner* — George B Bennett

(57) ABSTRACT

A high precision magnetic compass based on a Hall probe. The probe is oriented at an angle of 90 degrees to the rotation axis of the device. An oscillating component of the signal from the probe, synchronized with the device rotation, is transferred to the non-rotation frame and is used to align the axis of rotation to be parallel to the magnetic field. The device does not require prior calibration. It is insensitive to drift of the probe parameters and can provide an angle with precision equal to or better than a 0.05 degree.

11 Claims, 5 Drawing Sheets

(56) References Cited

U.S. PATENT DOCUMENTS

| | | | | |
|---|---|---|---|---|
| 9,780,435 | B2* | 10/2017 | McAllister | G05D 1/0261 |
| 10,585,147 | B2* | 3/2020 | Romero | G01D 5/145 |
| 10,994,108 | B2* | 5/2021 | Boden, Jr. | A61M 27/006 |
| 2015/0176964 | A1* | 6/2015 | Uberti | G01B 7/004 |
| | | | | 702/95 |
| 2019/0172275 | A1* | 6/2019 | Elson | G07C 5/0808 |
| 2020/0131898 | A1 | 4/2020 | Wu | |
| 2021/0165388 | A1* | 6/2021 | Wang | G05D 1/0094 |
| 2023/0250804 | A1* | 8/2023 | Farb | F03B 15/06 |

OTHER PUBLICATIONS

Dietrich, M. R., et al., "Alignment of a Vector Magnetometer to an Optical Prism", The Review of scientific instruments, Dec. 2016, vol. 88, Journal Issue 5.

* cited by examiner

SPINNING HALL PROBE COMPASS

This application claims the priority of Provisional U.S. Patent Application Ser. No. 63/158,172 filed Mar. 8, 2021.

The United States Government may have certain rights to this invention under Management and Operating Contract No. DE-AC05-06OR23177 from the Department of Energy.

FIELD OF THE INVENTION

The present invention relates to electron scattering studies, and, more particularly, to a device and method for determining the magnetic field direction of the nuclei polarization in a target.

BACKGROUND OF THE INVENTION

In electron scattering studies of subatomic particles, there is a need to determine the magnetic field direction of the nuclei polarization in a target within 1 milliradian (mrad), which is equivalent to within 0.05 degree or better. The studies are typically carried out in an environment where the magnetic field is 25-30 Gauss.

Conventional 3D vector magnetometers typically cannot achieve this level of accuracy without frequent and costly calibration, and, due to limited stability, cannot provide required accuracy of the field direction in a magnetic field of this magnitude. Conventional magnetic compasses are limited to an accuracy of 1-2 degrees, which is inadequate for scattering studies of particles at relativistic speeds. Recently developed magnetic sensors in smart phones based on a Hall probe also have accuracy limited by 1 degree.

There are conventional rotating field mappers based on a multi turn coil. They operate in a strong transverse magnetic field of 1 Tesla but do not have sufficient sensitivity at longitudinal field of 25-30 Gauss for required accuracy of the field direction.

Accordingly, there is a need for a compass that achieves an accuracy of at least 1 mrad or 0.05 degree, and which can operate in a magnetic field of 25-30 Gauss. Such a high precision magnetic compass would have a wide range of applications in the conventional field of navigation on the Earth, would offer a more accurate instrument in the search for small magnetic objects, and would provide an accurate survey of magnetic field direction for use in space exploration.

BRIEF SUMMARY OF THE INVENTION

The invention is a high precision magnetic compass based on a Hall probe. The Hall probe axis of sensitivity is oriented at an angle of 90 degrees to the rotation axis of the device. An oscillating component of the signal from the Hall probe is transferred to a non-rotation frame. The oscillating signal, synchronized with the device rotation, is used to align the axis of rotation to be parallel to the magnetic field. The device does not require prior calibration. It is insensitive to drift of the probe parameters and can provide an angle with precision equal to or better than a 0.05 degree.

The invention is based on a geometrical property of the magnetic field: The vector product of the magnetic field vector and some additional vector has a zero value only when that additional vector is parallel to the magnetic field vector. The key element of our invention is the flipping of the Hall probe plane by rotation of the Hall probe around the axis which represents that additional vector. The Hall probe should be mounted with its plane approximately parallel to the above axis of rotation, so as to be sensitive to the magnetic field transverse to the axis of rotation. As a result of spinning around the above axis, the signal from the Hall probe oscillates with an amplitude defined by the angle between the magnetic field and the axis of rotation. Minimization of the amplitude of the signal oscillation leads to the alignment of the axis being exactly parallel to the magnetic field vector.

OBJECTS AND ADVANTAGES

A first object of the invention is to improve the precision in determination of the magnetic field direction. The direction of the nuclei polarization in the target needs to be determined to 0.05 degree or better.

A second objective of the invention is to provide a compass which is sensitive to the direction of the field and doesn't need prior calibration and temperature control.

Another objective of the invention is to provide a compass that can operate with required accuracy in a magnetic field of 25-30 Gauss.

Yet another objective of the invention is to provide a compass that is insensitive to the drift of the probe parameters.

These and further objects and advantages will become clear when reading the following specification along with reference to the associated drawings.

BRIEF DESCRIPTION OF THE SEVERAL VIEWS OF THE DRAWING(S)

Reference is made herein to the accompanying drawings, which are not necessarily drawn to scale, and wherein.

DETAILED DESCRIPTION OF THE INVENTION

The invention is a high precision spinning Hall probe compass based on a Hall probe. The spinning probe compass includes a Hall probe that is oriented at an angle of 90 degrees to the rotation axis of the device. An oscillating component of the signal from the probe is transferred to a non-rotation frame. The oscillating signal, synchronized with the Hall probe rotation, is used to decide how to align the axis of rotation of a spinning rotor. The oscillating signal has a minimum (potentially a value equal to zero) when the axis of rotation is parallel to the magnetic field. The high precision magnetic compass does not require prior calibration. It is insensitive to drift of the probe parameters and can provide an angle with precision on the level or better than 0.05 degree.

Figure 1:
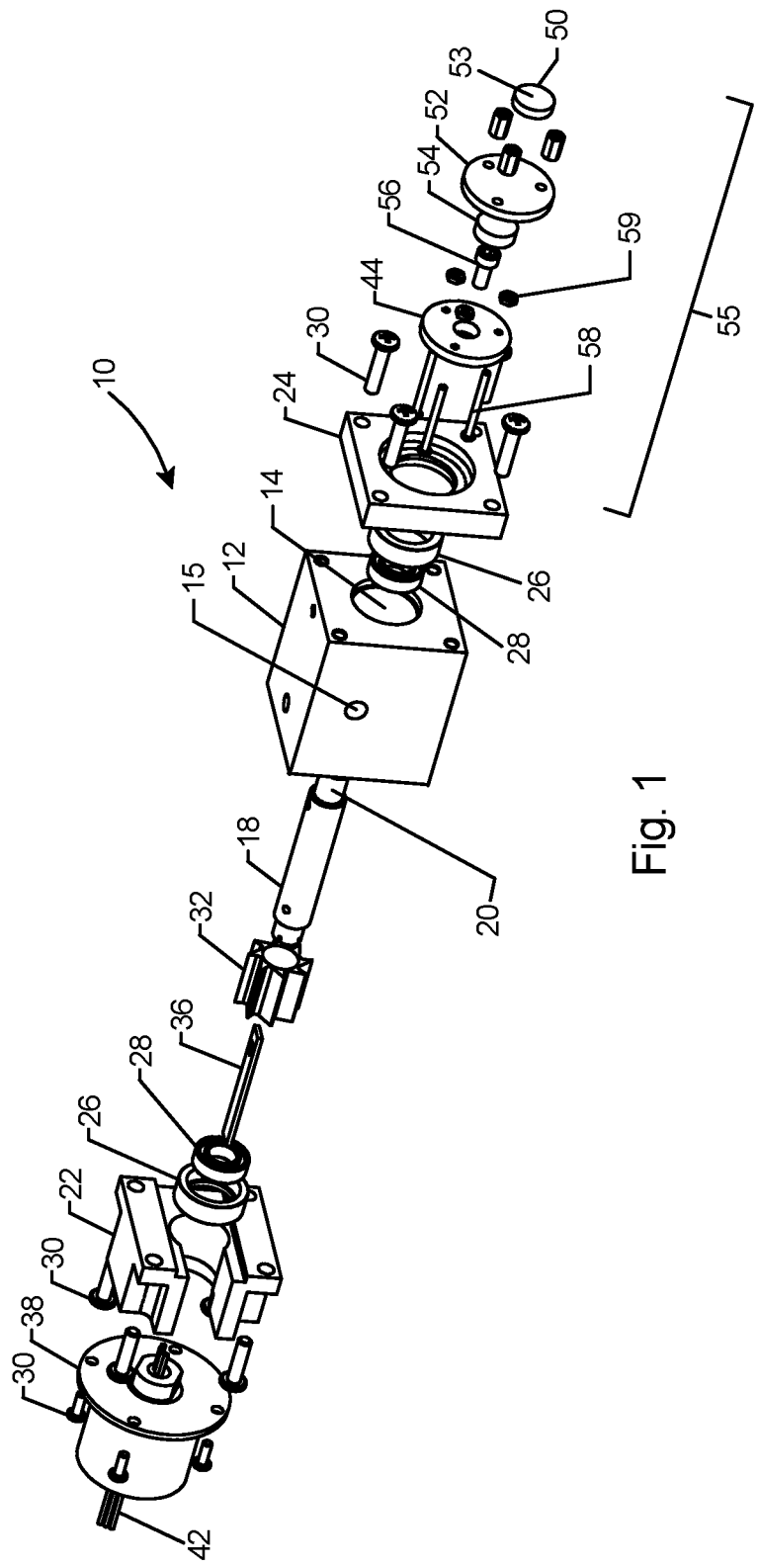
FIG. 1 is an exploded isometric view of a first embodiment of a spinning Hall probe compass according to the invention.
Figure 2:
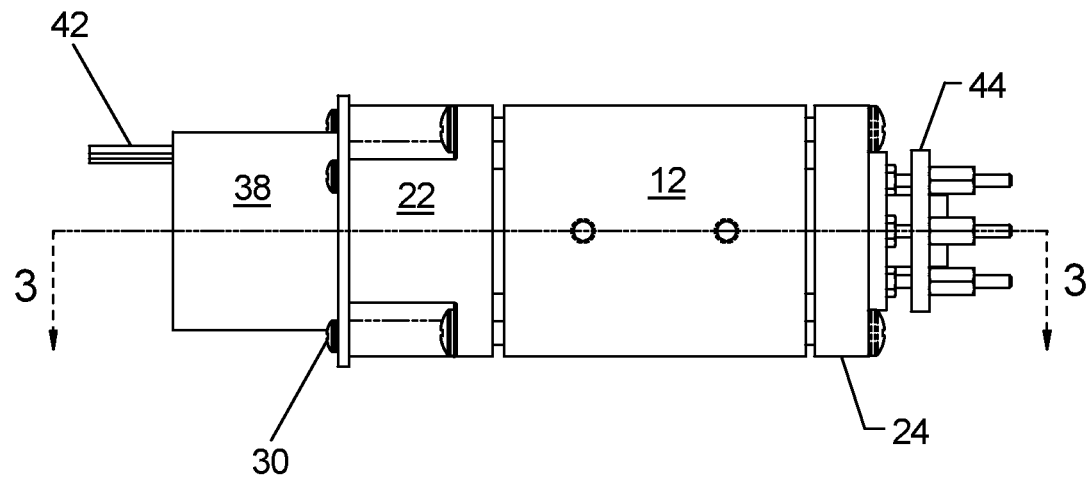
FIG. 2 is a side view of a portion of the compass of FIG. 1.
Figure 3:
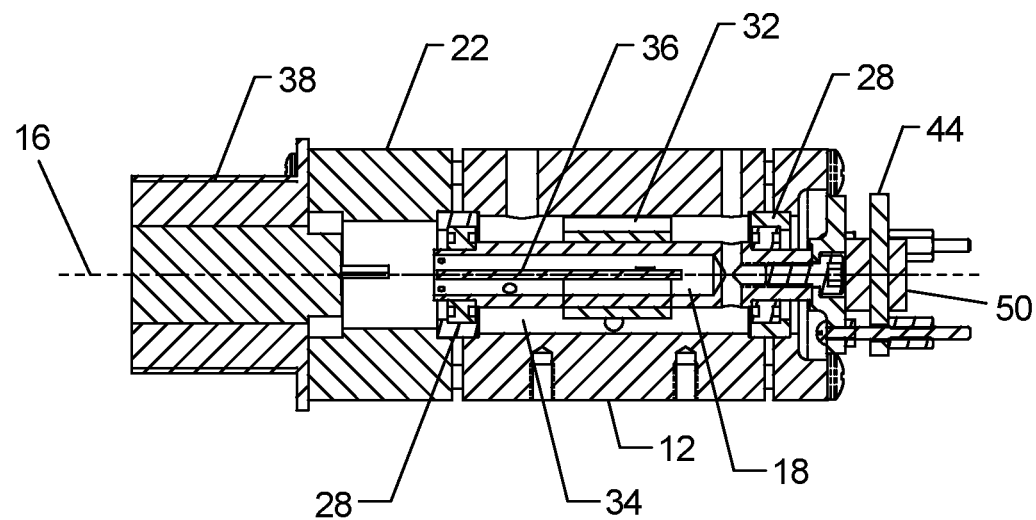
FIG. 3 is a sectional view of the compass taken along line 3-3 of FIG. 2.

With reference to FIGS. 1-3, the first embodiment of the spinning Hall probe compass 10 includes a non-rotation housing 12 with two ends and a cavity 14 therein. An air-port 15 is provided in the housing, the air-port oriented substantially orthogonal to the cavity axis 16 (see FIG. 3). A rotor 18 is rotationally mounted within the housing cavity 14. Rotor 18 has two ends and a cylindrical section 20 to accept a bearing on each end. A slip ring adapter 22 and a cap 24 each include a bearing holder 26 and a bearing 28 mounted therein. The slip ring adapter 22 and cap 24 are secured at each end of the housing by threaded studs 30 and hold the rotor within the cavity 14 while the bearings 28 enable rotation of the rotor 18 within the housing 12. A turbine 32 is secured to the rotor 18. As shown in FIG. 3, a probe cavity 34, provided in the rotor 18, includes a Hall probe 36 therein.

A high speed slip ring 38 is connected to the rotor 18 via a flexible link. The slip ring 38 is fitted within the slip ring adapter 22 to allow, when in operation, rotation of the spinning rotor 18. Wires 42 are provided for carrying electrical signal-out at one end and for feeding the few volts of power needed to the spinning Hall probe 36 at the opposing end.

A mirror assembly 55 includes a mounting cap 44 secured to the rotor 18 by screw 56, a mirror 50, a mounting disc 52, and a washer 54 mounted between the mounting cap 44 and the mounting disc. Long bolts 58 and nuts 59 secure the mirror assembly 55 to the mounting disc 52. Mirror assembly 55 and mirror 50 thus rotate with the rotor 18. The reflective surface 53 of the mirror faces outward of the spinning Hall probe compass. Prior to use of the device, the mirror 50 is aligned to be approximately orthogonal to the axis of rotation.

Figure 7:
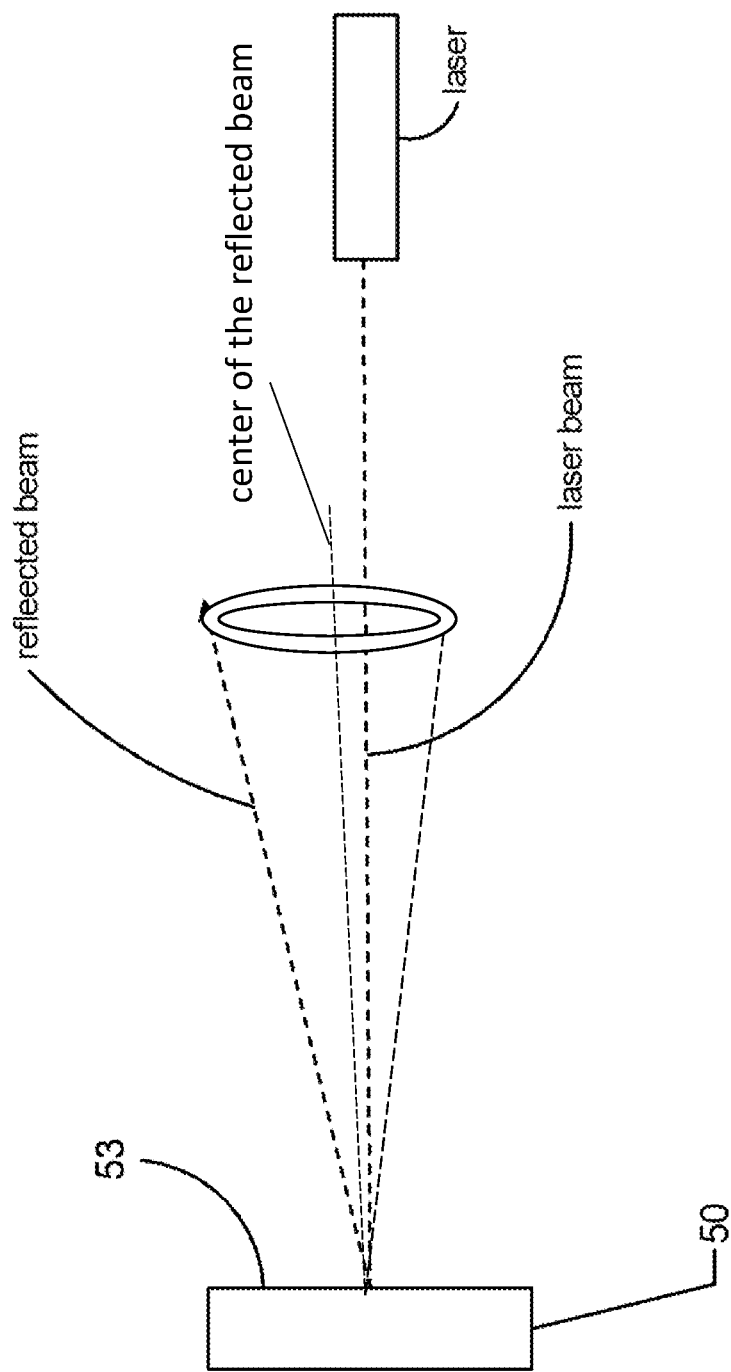
FIG. 7 is a schematic depicting an optical measurement arrangement for determining the axis of rotation of the spinning Hall probe compass of the invention.

With reference to FIG. 7, during measurement of the field direction the mirror 50 functions to determine the axis direction by optical methods, such as by directing a laser beam to the reflective surface 53 of the mirror 50 and measuring the shape and the center of the reflected beam. After the laser beam and the reflected beam centers coincide the laser beam has the same orientation as the axis 16 of the rotor 18.

With reference to FIG. 2, the arrangement of the assembled Hall probe compass 10 includes the non-rotation housing 12 and the signal-out wires 42. The slip ring adapter 22 and the cap 24 are secured at each end of the housing 12 by the threaded studs 30.

As shown in FIG. 3, the spinning Hall probe compass 10 includes a Hall probe 36 within the probe cavity 34 of the spinning rotor 18.

In operation of the first embodiment of the spinning Hall probe compass, the bearings 28 enable the rotor 18 to rotate freely within the housing 12. Air is introduced through an air-port 15. Air blowing through the air-port impinges on the turbine 32 and causes the rotor to spin at a high rate of rotation. The spinning rotor 18 has an axis of rotation 16. With air flowing through the air-port of the housing, the rotor 18 will spin. The Hall probe 36, mounted within the cavity 34 of the spinning rotor 18, has an axis of sensitivity that is oriented at an angle of approximately 90 degrees to the rotation axis of the spinning rotor. An oscillating component of the signal from the probe 36 is transferred to the non-rotation frame or housing 12 and the signal, synchronized with rotation of the rotor 18, is used to align the axis of rotation 16 to be parallel to the magnetic field.

Preferably, the Hall probe 36 is a chopper-stabilized Hall Integrated Circuit (IC) that offers a magnetic sensing solution with sensitivity stability over temperature and integrated protection features. The probe IC includes a 0- to 2-V analog output that responds linearly to the applied magnetic flux density, and distinguishes the polarity of the magnetic field direction. Most preferably, the Hall probe is a DRV5053 analog-bipolar hall-effect sensor device available from Texas Instruments in Dallas, Texas.

Alternatively, the magnetic field sensor could be made by using the anisotropic Giant Magnetic Resonance effect in place of the Hall probe. The isotropic Giant Magnetic Resonance (GMR) effect sensor could be also used but the location of the probe should be off the axis of the rotor to allow sensitivity of the device to the magnetic field gradient. GMR effect sensors are available from TE Connectivity in Berwyn, Pennsylvania.

Figure 4:
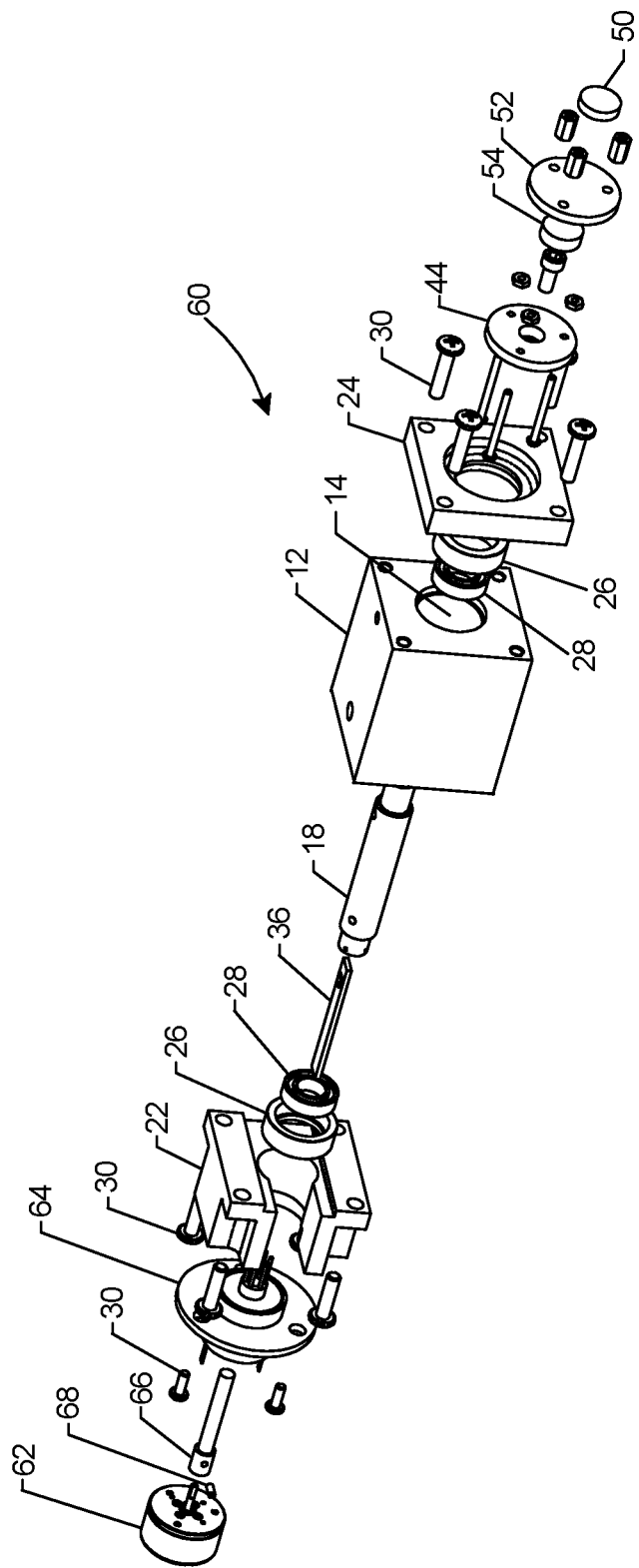
FIG. 4 is an exploded isometric view of a second embodiment of a spinning Hall probe compass according to the invention.
Figure 5:
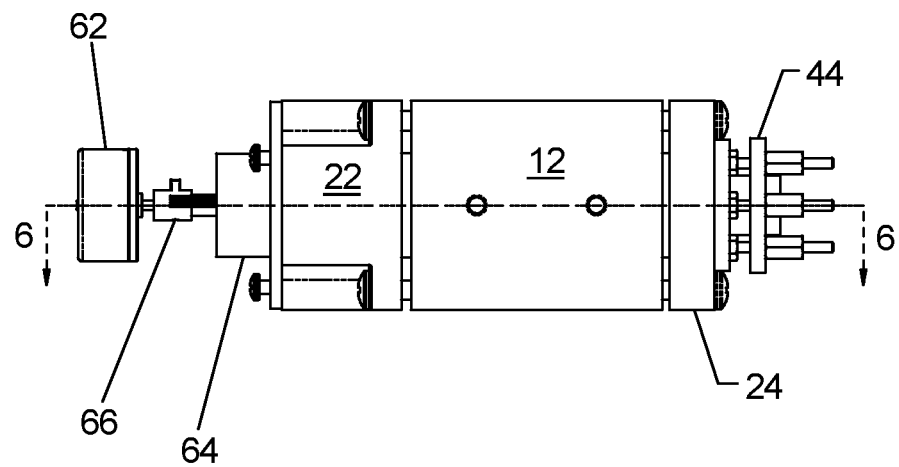
FIG. 5 is a side view of a portion of the compass of FIG. 4.
Figure 6:
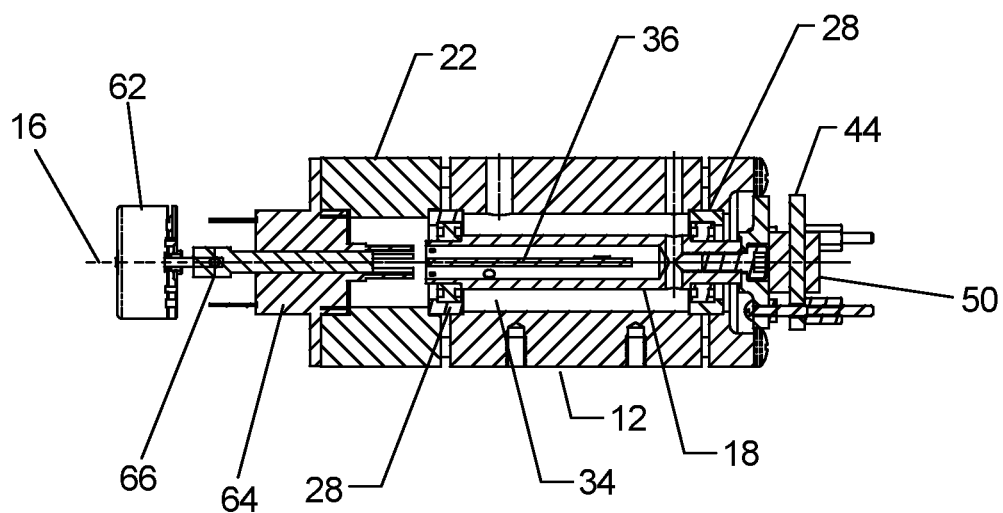
FIG. 6 is a sectional view of the compass taken along line 6-6 of FIG. 5.

With reference to FIGS. 4-6, a second embodiment of the spinning Hall probe compass 60 includes a piezo-electrical motor 62 to impart rotation to the rotor 18, thus eliminating the need for an air supply and a turbine. In this embodiment, the oscillation signal transmission from the electronics of the Hall probe 36 to the stationary readout electronics is arranged by means of the slip ring 64. The rotation of the rotor is activated by means of the piezo-electrical motor 62, which is connected to a through-hole slip ring 64 by an adapter 66 or, alternatively, is connected directly to the rotor 18. Instead of a slip ring 64, the oscillation signal could be digitized by a controller mounted on the rotor and broadcast to a receiver using a wireless signal such Bluetooth or ZigBee. It is also within the scope of the invention to include specialized readout electronics to advance the accuracy of the spinning Hall probe compass 60 by an additional one-two orders of magnitude.

As the invention has been described, it will be apparent to those skilled in the art that the same may be varied in many ways without departing from the spirit and scope thereof. Any and all such modifications are intended to be included within the scope of the appended claims.

What is claimed is:

1. A spinning Hall probe compass, comprising:
   a housing including two ends and a housing cavity;
   a rotor retained within the housing cavity;
   a probe cavity within the rotor;
   a Hall probe within the rotor; and
   a few electrical wires for providing power to the Hall probe and for transferring electrical signals from the Hall probe to the housing.

2. The spinning Hall compass probe of claim 1, comprising:
   a turbine on said rotor; and
   an air-port in said housing.

3. The spinning Hall compass probe of claim 2, comprising:
   a shaft at each end of the rotor; and
   a bearing on each of said shafts.

4. The spinning Hall compass probe of claim 3, comprising:
   a slip ring adaptor closing a first end of the housing; and
   a mounting cap closing a second end of the housing.

5. The spinning Hall compass probe of claim 4, comprising a slip ring fitted to the slip ring adapter.

6. The spinning Hall compass probe of claim 5, comprising a mirror assembly at the second end of the housing.

7. The spinning Hall compass probe of claim 6, wherein the mirror assembly comprises:
   a mirror; and
   a mirror mounting disc.

8. The spinning Hall compass probe of claim 7, comprising a washer between said mounting cap and said mirror mounting disc.

9. The spinning Hall compass probe of claim 8, comprising:
   said Hall probe includes an axis of sensitivity; and
   said axis of sensitivity is oriented at an angle of 90 degrees to the rotation of the rotor.

10. The spinning Hall compass probe of claim 1, comprising a piezo-electrical motor.

11. The spinning Hall compass probe of claim 10, comprising:
    a through-hole slip ring; and
    an adapter extending from the piezo-electrical motor through the through-hole slip ring and to the rotor.

\* \* \* \* \*